US006731004B2

(12) United States Patent
Saitoh

(10) Patent No.: US 6,731,004 B2
(45) Date of Patent: May 4, 2004

(54) ELECTRONIC DEVICE AND METHOD OF PRODUCING SAME

(75) Inventor: Kazuto Saitoh, Ohmihachiman (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/734,412

(22) Filed: Dec. 11, 2000

(65) Prior Publication Data

US 2001/0004134 A1 Jun. 21, 2001

(30) Foreign Application Priority Data

Dec. 15, 1999  (JP) .......................... 11-355236

(51) Int. Cl.[7] .................. H01L 23/48; H01L 23/52; H01L 29/40
(52) U.S. Cl. .............. 257/747; 257/750; 257/758; 257/635
(58) Field of Search ............... 257/759, 758, 257/760, 751, 754, 755, 756, 757, 765, 774, 778, 780, 762, 747, 750, 635–645, 637–639, 779

(56) References Cited

U.S. PATENT DOCUMENTS

| | | | | |
|---|---|---|---|---|
| 4,090,851 A | * | 5/1978 | Berkman et al. ......... | 117/211 |
| 4,862,237 A | * | 8/1989 | Morozumi ................. | 257/72 |
| 5,068,714 A | * | 11/1991 | Seipler ...................... | 257/703 |
| 5,374,469 A | * | 12/1994 | Hino et al. ................. | 428/209 |
| 5,659,201 A | * | 8/1997 | Wollesen ................... | 257/758 |
| 5,864,178 A | * | 1/1999 | Yamada et al. ............ | 257/737 |
| 5,960,306 A | * | 9/1999 | Hall et al. .................. | 438/612 |
| 6,071,809 A | * | 6/2000 | Zhao .......................... | 438/634 |
| 6,187,615 B1 | * | 2/2001 | Kim et al. .................. | 438/113 |
| 6,555,015 B1 | * | 4/2003 | Dailey et al. .............. | 216/17 |

FOREIGN PATENT DOCUMENTS

JP       62254446 A    * 11/1987

OTHER PUBLICATIONS

Harper, Charles A., "Electronic Packaging and Interconnection Handbook", McGraw–Hill, Inc., p. 1.35, 1991.*

* cited by examiner

Primary Examiner—George Eckert
Assistant Examiner—Chris C. Chu
(74) Attorney, Agent, or Firm—Schmeiser, Olsen & Watts; William H. Steinberg

(57) ABSTRACT

An electronic device and method of making same wherein the device includes a substrate (e.g., a printed wiring board or semiconductor chip) having a circuit thereon, a first non-photosensitive layer (e.g., polyimide resin) positioned on the substrate and over the substrate's circuit, a second, photosensitive layer (e.g., epoxy resin) positioned on the first layer, and an electrically conductive layer positioned on the first, non-photosensitive layer and electrically coupled to the circuit through a hole in the first layer.

13 Claims, 12 Drawing Sheets

F I G. 1 3 (a)
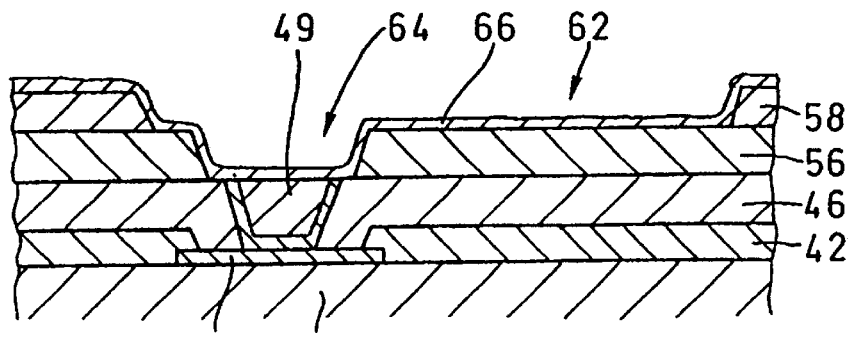
F I G. 1 3 (b)
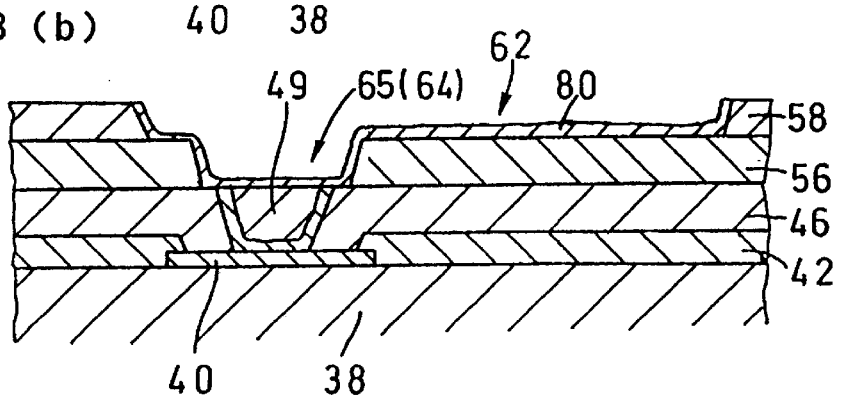
F I G. 1 4
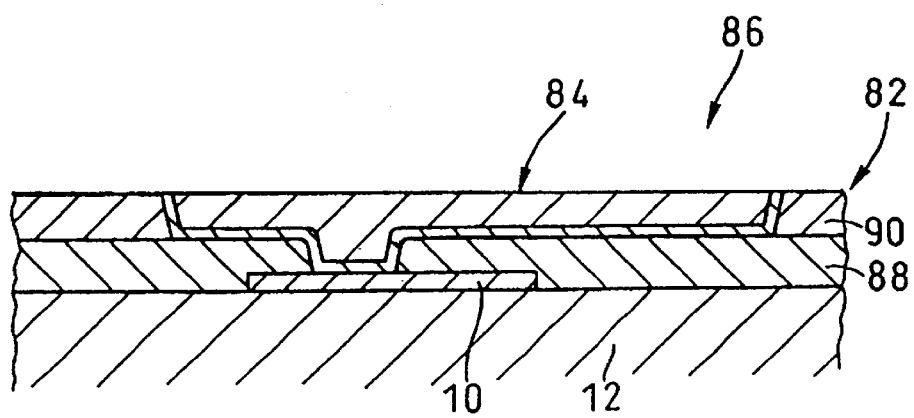

ELECTRONIC DEVICE AND METHOD OF PRODUCING SAME

TECHNICAL FIELD OF THE INVENTION

The present invention relates to an electronic device such as a semiconductor device and a printed wiring board, and a method of making the same. More particularly, the present invention relates to a technology for forming a multilayer wiring structure including a via connection.

BACKGROUND OF THE INVENTION

In a process of producing a semiconductor device, wiring board, or the like, a multilayer interconnection is formed as follows. First, a photosensitive resin layer acting as an interlayer insulating layer is formed on a substrate with a circuit formed thereon, and then it is exposed to light and developed to form a via hole therein. Next, a copper layer is plated on the developed layer and a photoresist layer is then deposited on the copper layer. The photoresist layer is exposed to light and developed in the same manner as the above for patterning. In accordance with the patterned photoresist layer, the copper layer is etched and patterned to form a circuit and a via hole (or several such holes). Thus, a two-layered circuit structure is formed.

Where a multilayer circuit is formed, the aforementioned process has to be repeatedly conducted. A repeat of such a complicated process for each circuit layer results in lower productivity and higher production costs.

If there is a relatively big difference between the coefficients of thermal expansion of the substrate and a component which is to be mounted on the substrate, connection failure may result when both are subjected to elevated temperatures, thus lowering the reliability of the device. One possible approach to overcoming this problem is to provide an underfill resin in the small space between substrate and component. However, as technology progresses (and especially as increased wiring densities in smaller areas are demanded), the space between substrate and component is getting narrower and narrower, which makes it relatively difficult to adequately provide sufficient underfill, resulting in a possible filling failure. For this reason, it is desired to provide a reliable connection without filling an underfill resin.

In a conventional method of producing a built-up printed wiring board, there may be a case where a metallized circuit layer is formed on an insulating layer having a via hole, and another insulating layer having a via hole is then formed over the circuit layer. In this case, if the via holes in both insulating layers overlap in position and the via hole of the lower layer is not completely filled with metal, insulating resin of the upper insulating layer may flow into the unfilled space in the lower via hole. As a result, a recessed part is formed in the surface of the upper layer and defocusing occurs during the exposing step, so that the precise formation of a via hole with a desired diameter becomes relatively difficult. If the via hole of the lower layer is completely filled with metal such as copper, the above problem does not occur. However, in practice, it is often difficult to completely fill the lower via hole with metal.

It is believed, therefore, that an electronic device (e.g., printed wiring board) that can be made in an efficient manner while overing the aforementioned advantages of earlier methods and devices made by same would constitute a significant advancement in the art.

OBJECTS AND SUMMARY OF THE INVENTION

An object of the present invention is to provide an improved method for forming a multilayer wiring structure including a via connection on the structure's substrate.

Another object of the present invention is to provide such a method which will result in a structure having more reliable connections between substrate and electronic device mounted on the substrate, by focusing on the coefficients of thermal expansion of various insulating layers laminated to the substrate.

According to one aspect of the invention, there is provided a method comprising the steps of providing a substrate, forming a circuit on the substrate, forming a non-photosensitive resin layer on the substrate, the non-photosensitive resin layer substantially covering the circuit, forming a photosensitive resin layer on the non-photosensitive resin layer, forming a patterned opening in the photosensitive resin layer relative to the circuit, forming a hole in the non-photosensitive resin layer to expose the circuit, and forming an electrically conductive layer on the non-photosensitive resin layer and the hole, the electrically conductive layer electrically coupled to the circuit.

According to a still further aspect of the invention, there is provided an electronic device comprising a substrate, a circuit positioned on the substrate, a first insulating layer positioned on the substrate substantially over the circuit and having a hole therein oriented directly above the circuit and contiguous thereto, a second insulating layer, positioned on the first insulating layer and including a patterned opening directly over the hole, formed of a material different from the first insulating layer, and formed on the first insulating layer in such a manner that the small hole is positioned in the larger hole, and an electrically conductive layer positioned on the non-photosensitive layer and substantially filling the hole, the electrically conductive layer being electrically coupled to the circuit.

BRIEF DESCRIPTION OF THE DRAWINGS

FIGS. 13(a) and 13(b) are enlarged, partial sectional views showing process steps in a further embodiment of the method of producing an electronic device according to the present invention.

FIG. 14 is an enlarged, partial sectional view showing another embodiment of the electronic device according to the present invention.

BEST MODE FOR CARRYING OUT THE INVENTION

Figure 1:
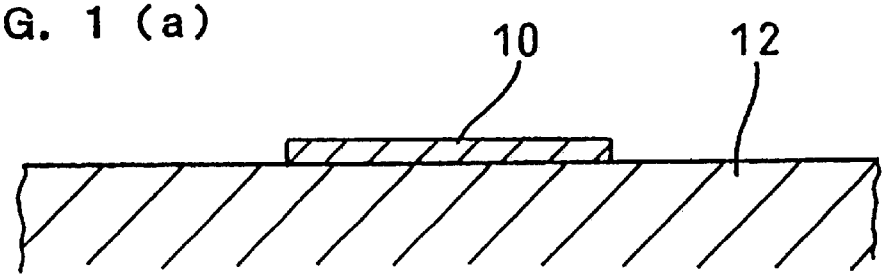
FIGS. 1(a) to 1(e) are enlarged, partial sectional views showing process steps in one embodiment of a method of producing an electronic device according to the present invention.
Figure 1:
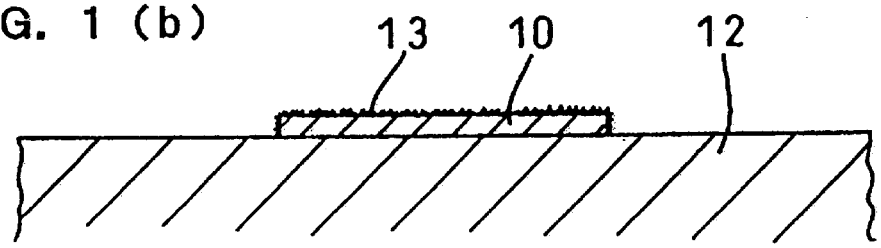
Figure 1:
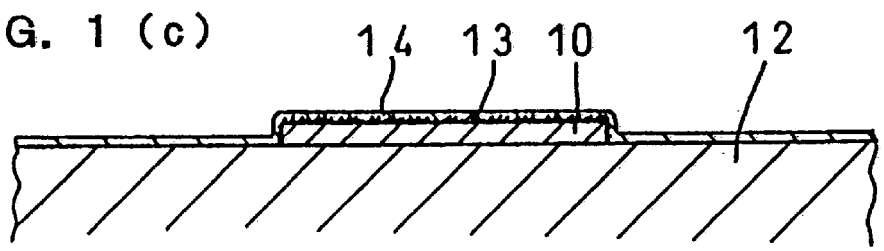
Figure 1:
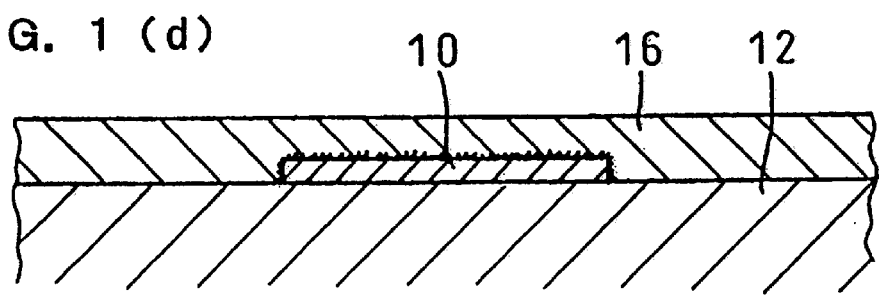
Figure 1:
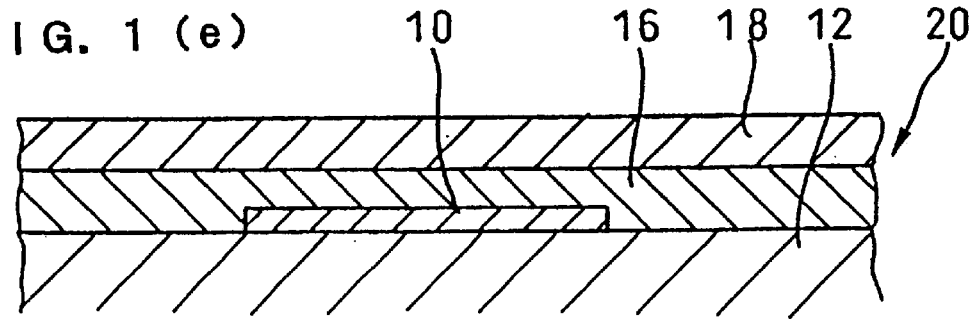

In one example, a circuit is first formed on a substrate by a general method. The substrate used herein may be epoxy substrate, glass fiber-reinforced epoxy substrate, ceramic substrate, glass substrate for a liquid crystal panel, silicon (Si) substrate, and the like. Second, a non-photosensitive resin layer is formed on this substrate to cover the circuit, by heat-pressing a non-photosensitive resin sheet on the substrate, or by thermally curing a non-photosensitive resin solution applied to the substrate. Next, a photosensitive resin layer is formed on this non-photosensitive resin layer by the same method as used in the formation of the non-photosensitive resin layer.

In this two-layered structure, the surface of the uppermost photosensitive layer is relatively flat. The surface of the substrate on which the circuit is formed is uneven because of the wiring present. However, the non-photosensitive resin layer and the photosensitive resin layer act to compensate for the unevenness, thereby providing a substantially flat top surface. The interface between the non-photosensitive resin layer and the photosensitive resin layer is also flat because no treatment is applied to the surface of the non-photosensitive resin layer.

The uppermost photosensitive resin layer is then exposed to light and developed to form a predetermined opening pattern. At this time, the lower non-photosensitive resin layer is not affected. Then, a laser beam is applied to a predetermined position of the non-photosensitive resin layer exposed by the patterning of the photosensitive resin layer to form a via hole.

After that, a metal is deposited (e.g., by plating) on a surface area, including the via hole and the opening pattern. Then, the metal on the top surface of the photosensitive resin layer is removed by grinding to provide a planarized surface, and thus a patterned metal circuit and metal via is formed.

The electronic device of the present invention as will be defined in greater detail below comprises a substrate with a circuit formed thereon, a first insulating layer which is formed on the substrate and has a small hole in a position on the circuit, a second insulating layer which is formed of a material different from the first insulating layer (and has a hole larger than the small hole) and is formed on the first insulating layer in such a manner that the small hole is positioned in alignment with the larger hole. An electrically conductive metal is filled in the small hole and the larger hole and is flush with the second insulating layer. The substrate, first insulating layer, and second insulating layer increase in coefficient of thermal expansion in the order named.

According to the electronic device of the present invention, the electrically conductive metal filled in the small hole in the first insulating layer and in the larger hole in the second insulating layer is seamlessly formed. For this reason, a connection failure does not occur in the electrically conductive metal filled in the small and the larger holes. The substrate, first insulating layer and second insulating layer are such that these increase in coefficient of thermal expansion in the order named. In this arrangement, when the substrate having a low coefficient of thermal expansion and the second insulating layer having a high coefficient of thermal expansion are thermally expanded or thermally contracted, the first insulating layer sandwiched between them exhibits a neutral behavior, so that internal thermal stresses at the interfaces are buffered and a connection reliability of a metal via can be secured.

Where the substrate is a semiconductor chip, bumps may be formed on the chip with the first and the second insulating layers formed on the chip. On the other hand, a printed wiring board on which this semiconductor chip is to be mounted may also be formed by the method of the present invention. When the uppermost layer of the printed wiring board is formed of the same material as the second insulating layer of the semiconductor chip, the uppermost layer and the second insulating layer will exhibit the same thermal expansion and contraction. Where the printed wiring board is a substrate formed by a conventional method, the second insulating layer of the semiconductor chip and the surface layer of the substrate will exhibit substantially the same thermal expansion and contraction. Therefore, even if an under fill resin is not filled, a connection failure due to heat cycle will not occur on the semiconductor chip mounted on the printed wiring board.

According to the present invention, a photolithography step is carried out only once for each wiring level, and a step of etching a metal layer to form a circuit is omitted, so that productivity can be greatly increased.

Further, the substrate, first insulating layer, and second insulating layer are arranged in such a manner that these increase in coefficients of thermal expansion in the order named. This arrangement is effective to alleviate thermal stress.

Next, embodiments of the electronic device and the method of making the same according to the present invention will be hereinafter described in detail with reference to the accompanying drawings.

As shown in FIG. 1(a), a substrate 12 with a circuit 10 formed thereon is used. Examples of the substrate 12 include a epoxy substrate, glass fiber-reinforced epoxy substrate, ceramic substrate, and the like. The circuit 10 can be obtained by patterning a copper thin film or the like using a general method. As shown in FIG. 1(b), circuit 10 is subjected to an oxidation treatment to roughen its surface, so as to increase adhesive strength between the circuit and an insulating layer to be formed thereon. A roughened surface is indicated as numeral 13 in FIG. 1(b). Where the circuit 10 is formed of copper, the surface of this circuit 10 is subjected to oxidation by spraying or soaking the circuit 10 in an oxidizing agent such as sodium chlorite, sodium hypochlorite, potassium chlorate, potassium perchlorate, and potassium persulfate.

As shown in FIG. 1(c), substrate 12 and circuit 10 are then coated with an adhesion promoter 14 to bring an insulating layer, which will be described later, into intimate contact with substrate 12 and circuit 10. As applied, the insulating layer will not easily be removed. Examples of adhesion promoter 14 include silane coupling agents and the like.

Then, as shown in FIG. 1(d), a non-photosensitive resin insulating layer 16 is formed by laminating (heat-pressing) an insulating sheet of non-photosensitive resin onto substrate 12. At this time, the surface of the non-photosensitive resin layer 16 is pressed flat by the heat and pressure, with the circuit 10 completely embedded therein. The thickness of the insulating sheet 16 is in a range of several $\mu$m (microns) to several hundred $\mu$m, but the sheet is preferably much thicker than the circuit 10.

Then, as shown in FIG. 1(e), a photosensitive resin layer 18 is laminated onto the non-photosensitive resin layer 16, using heat and pressure. In this way, a composite insulating layer 20 comprised of layers 16 and 18 is formed. It is preferable that the insulating sheets be laminated under vacuum, so as not to trap air bubbles between the substrate 12 and the non-photosensitive layer 16 or between layer 16 and the subsequent photosensitive layer 18. As in the case of layer 16, the photosensitive sheet may have a thickness of several $\mu$m to several hundred $\mu$m. However, it is preferable that the thickness of layer 18 be of an initial thickness greater than eventually desired because layer 18 will be reduced (e.g., ground down) in a later manufacturing step.

Various known non-photosensitive resins can be used in the invention. For example, an insulating film named MCF-6000E (available from Hitachi Chemical Co., Ltd.) can be used. The photosensitive resin used herein is also not particularly limited, as various known photosensitive resins can be used. For example, an insulating film named BF-8000 (available from Hitachi Chemical Co., Ltd.) can be used.

Figure 2A:
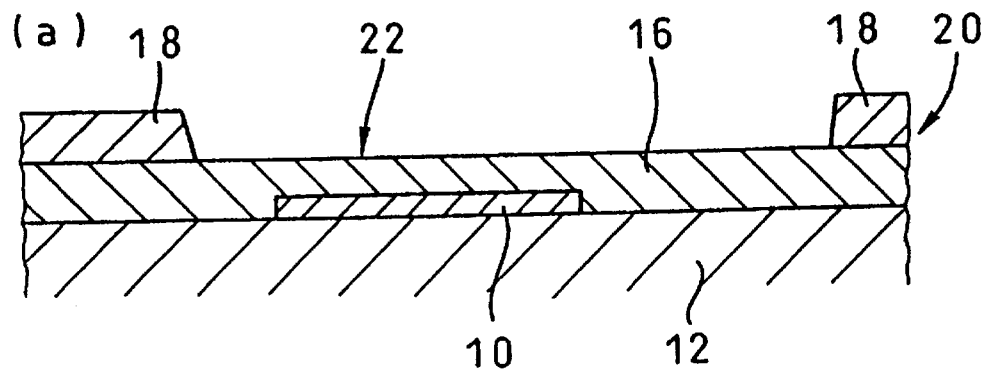
FIGS. 2(a) to 2(c) are enlarged, partial sectional views showing subsequent process steps in the method of producing an electronic device shown in FIGS. 1(a) to 1(e).

As shown in FIG. 2(a), the photosensitive resin layer 18 is exposed to light through a photomask (not shown) by a photolithography method and then developed, whereby a part of the photosensitive resin layer 18 is removed to form a patterned opening 22. Since lower layer 16 is non-photosensitive, it remains intact while opening 22 is formed in layer 18. Patterned opening 22 defines the shape of a conductor to be formed on layer 16.

Figure 2B:
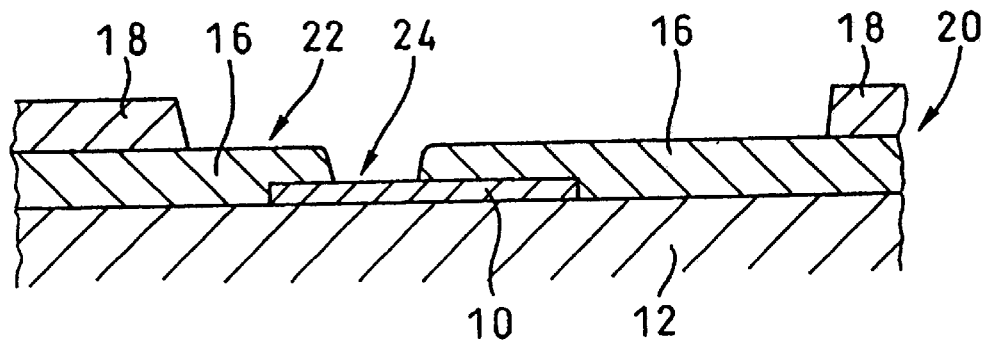
Figure 2C:
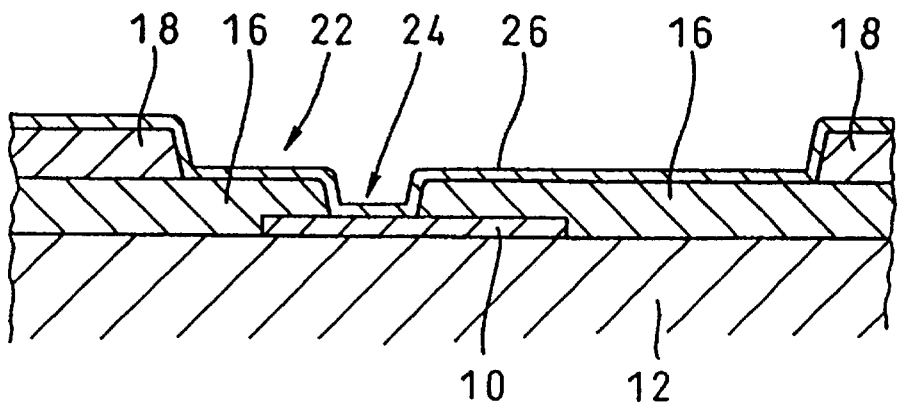
Figure 3A:
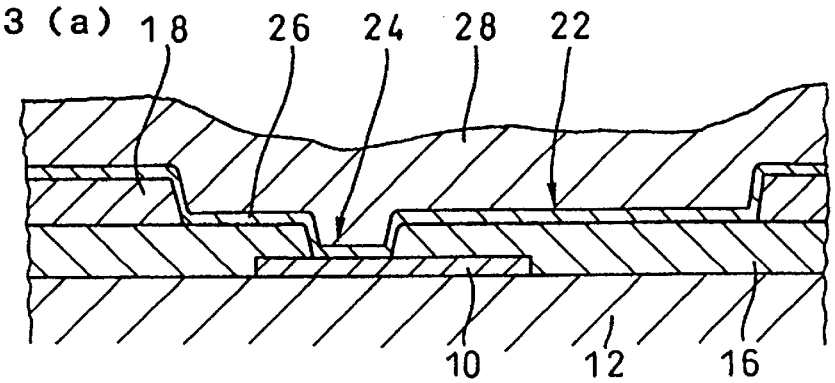
FIGS. 3(a) to 3(d) are enlarged, partial sectional views showing subsequent process steps in the method of producing an electronic device shown in FIGS. 1(a) to 1(e) and 2(a) to 2(c).
Figure 3B:
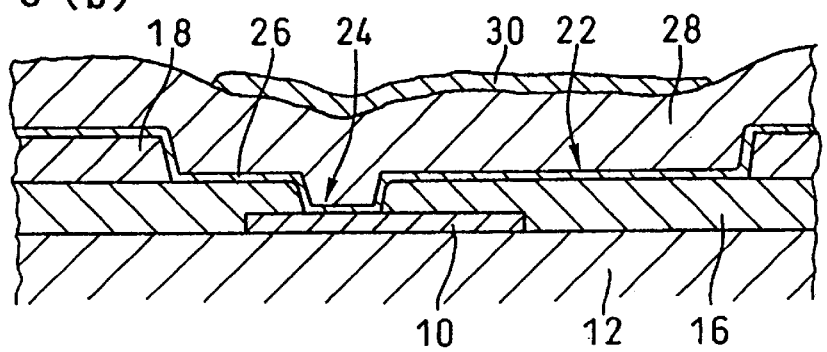
Figure 3C:
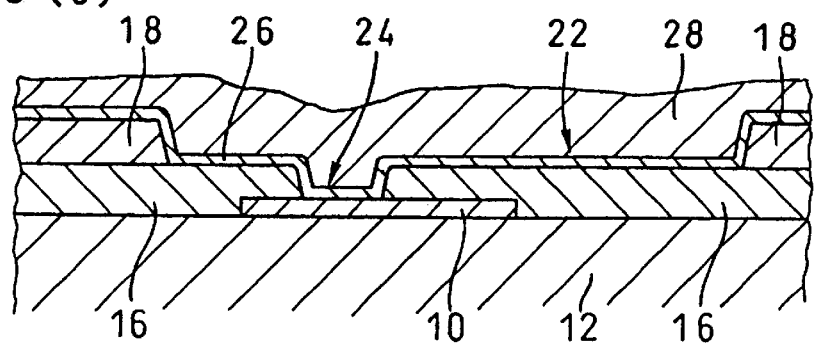

As shown in FIG. 2(b), a via hole 24 is formed in layer 16, preferably by laser beam drilling, at a designated location surrounded by opening 22 to expose a portion of circuit 10. Circuit 10 intercepts the laser beam such that the drilling stops at the upper surface of circuit 10. The laser beam used herein is not particularly limited, as almost any known laser irradiation apparatus can be used. However, it is preferable that the laser beam be selected for optimum operation on the particular material of layer 16. As shown in FIG. 2(c), a thin metal (e.g., copper) layer 26 is then formed (e.g., by electroless plating) on the exposed surfaces of both the photosensitive resin layer 18 and the underlying layer 16 left exposed by opening 22. After the thin copper layer 26 is formed, a thicker metallic (e.g., copper) film layer 28 is formed (e.g., by electroplating) in which the first copper thin film layer 26 is used as an electrode. See FIG. 3(a). Specifically, the copper thick layer 28 is thick enough to substantially fill the opening pattern 22 formed in the photosensitive resin layer 18 with the copper metal. The surface of the copper thick film layer 28 is not flat due to the depressed patterned opening 22 in layer 18. As shown in FIG. 3(b), a resist pattern 30 is now formed on a lower position of the copper thick film layer 28, e.g., using an electrodeposition photoresist or a film photoresist. Wet copper etching is then carried out to reduce the unevenness in the surface of layer 28. Resist pattern 30 is then removed. Copper etching is used to facilitate the subsequent planarization of layer 28, but may be omitted if the grinding apparatus to be used in the subsequent planarization step does not require such a pre-flattening operation.

Figure 3D:
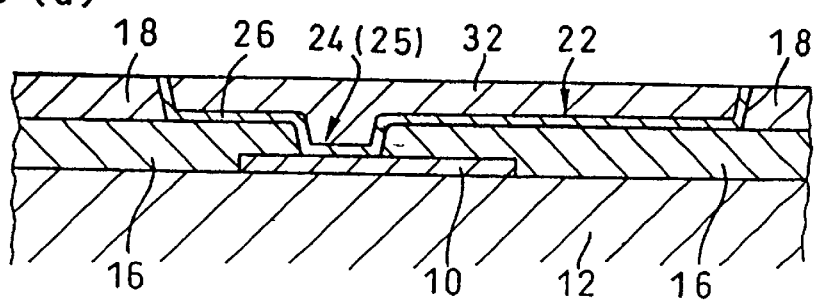

Copper thick film layer 28 is now ground substantially flat and co-planar with the top surface of layer 18, as seen in FIG. 3(d). As a result, only copper 28 fills both opening 22 and the lower via hole 24. Thus, an electrically conductive via (25) is formed in the non-photosensitive resin layer 16, and a circuit 32 is formed in the opening 22 of the photosensitive resin layer 18 simultaneously therewith.

Figure 4:
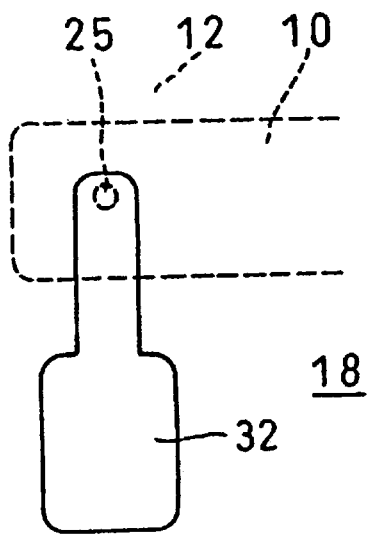
FIG. 4 is an enlarged plan view showing a main part of a pattern in a final step in the method of producing an electronic device shown in FIGS. 1(a) to 3(d).

FIG. 4 is a plan view showing an example of the circuits 10 and 32, and the conductive via 25 that can be formed using the teachings herein. In FIG. 4, circuit 32 is a relatively simple structure; however, a more complicated pattern can easily be formed. A line width of the circuit 32 is defined by the relative width of opening 22 formed in the photosensitive resin layer.

As described above, when a multi-layer wiring board is produced, only one exposing and developing process is used when forming the various elements, e.g., the via hole and circuit, with no etching process required to form the final pattern for circuits 10 and 32. This improves productivity. In the case of forming more circuits, additional wiring can be easily formed by repeating the above process. Understandably, a second via can be easily formed on the original via. Furthermore, in the electronic device produced by this method, the interface between the non-photosensitive resin layer 16 and the photosensitive resin layer 18 becomes substantially flat.

Figure 5:
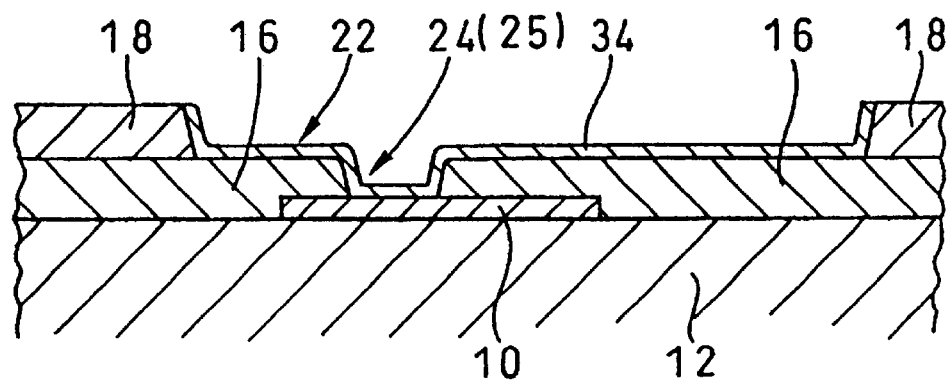
FIG. 5 is an enlarged, partial sectional view showing another embodiment of the method of producing an electronic device according to the present invention.

An embodiment of the electronic device and the method of producing the same according to the present invention has thus been described, however, the present invention is not limited to the above embodiment. For example, the copper thin film layer 26 can instead be formed by a vacuum deposition process. Thin film layers 26 and 28 can be formed of other metals than copper, provided these possess excellent conductivity.

Where a sufficient electrical continuity is ensured by the relatively thin copper layer 26, the subsequent copper thick film layer 28 does not necessarily have to be formed on layer 26. In this case, after the copper thin film layer 26 is formed as shown in FIG. 2(c), those portions of the layer 26 formed on the surface of the photosensitive resin layer 18 may be removed by grinding, so that a circuit 34 and the conductive via 25 can be formed of copper thin film layer 26 remaining in opening 22, as shown in FIG. 5.

In the above embodiment, non-photosensitive resin and photosensitive resin sheets have been laminated (heat-pressed) to form layers 16 and 18. Instead of heat-pressing, liquid resin can be applied with a coater, for example, and then hardened, one layer at a time.

Figure 6:
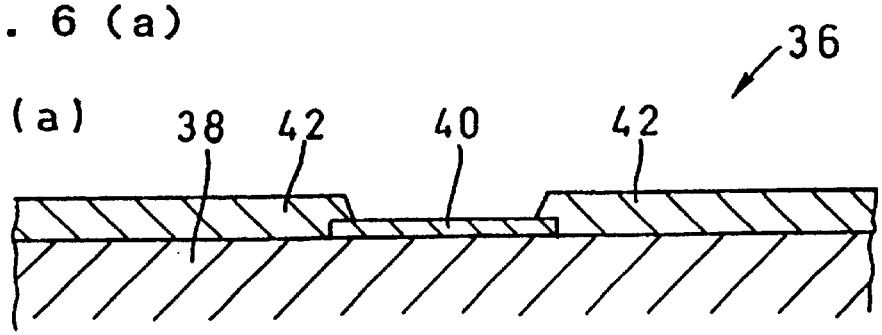
FIGS. 6(a) to 6(d) are enlarged, partial sectional views showing process steps in another embodiment of the method of producing an electronic device according to the present invention.
Figure 6:
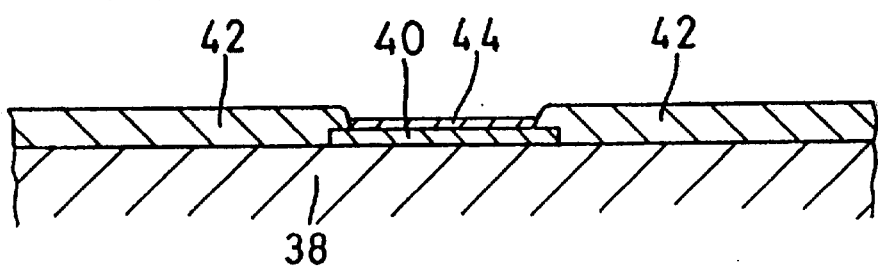
Figure 6:
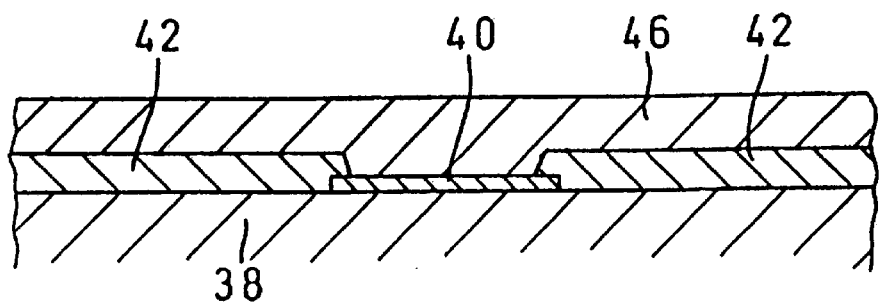
Figure 6:
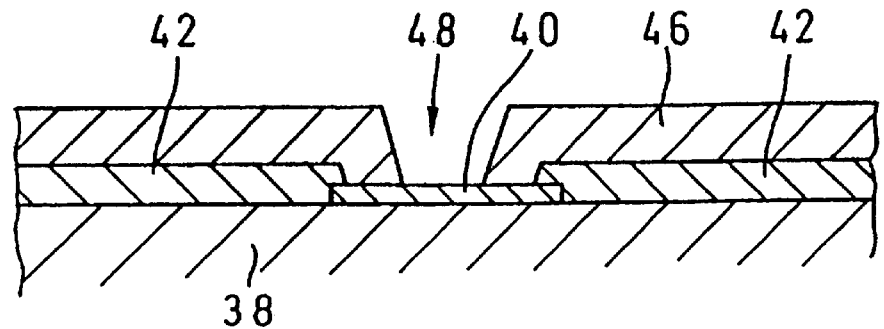

Next, an embodiment of the present invention as applicable to the formation of wiring on a semiconductor wafer will be described. In this embodiment, a product wafer 36 is used as shown in FIG. 6(a). This product wafer 36 comprises a semiconductor wafer in which a circuit and the like (not shown) are formed. The semiconductor wafer is covered with a glass film or resin film 38. On the surface of film 38, an aluminum bonding pad 40 or the like is formed. The surface of film 38, including the edges of bonding pad 40, are covered with a surface protective film 42.

As shown in FIG. 6(b), nickel and gold are deposited one after another on the aluminum bonding pad 40, preferably by electroless plating, to thus form a composite metal layer on the surface of pad 40. Only one layer is shown for illustration purposes. Alternatively, the aluminum surface may be subjected to zincate or other general treatments. Instead of nickel and gold, copper may be deposited. In the following drawings, the metal layer 44 is not shown, again for illustration purposes.

After an adhesion promoter is sprayed on the product wafer 36, liquid photosensitive insulating material is applied to the product wafer with a coater or the like, as shown in FIG. 6(c), and then is cured to form layer 46. As shown in FIG. 6(d), layer 46 is exposed to light through a photomask (not shown) by a general method, and developed to form a via hole 48. It is preferable that the via hole 48 is formed to expose the bonding pad 40, its lower opening size being smaller than the size of pad 40. Preferably, pad 40 is shaped like a circle or rectangle (e.g., square). The photosensitive resin layer 46 is thermally cured and then the top surface thereof is ground. The ground surface of layer 46 is then roughened (not shown) after removing dirt therefrom using a cleaning solvent or the like. Conventional grinding and roughening processes can be used, and further description is not deemed necessary.

Figure 7A:
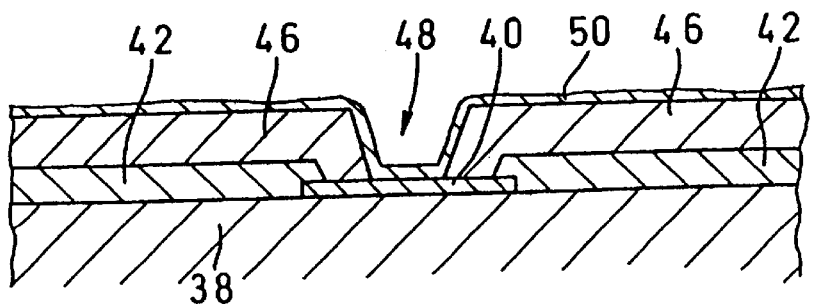
FIGS. 7(a) to 7(d) are enlarged, partial sectional views showing subsequent process steps in the embodiment of the method of producing an electronic device shown in FIGS. 6(a) to 6(d).
Figure 7B:
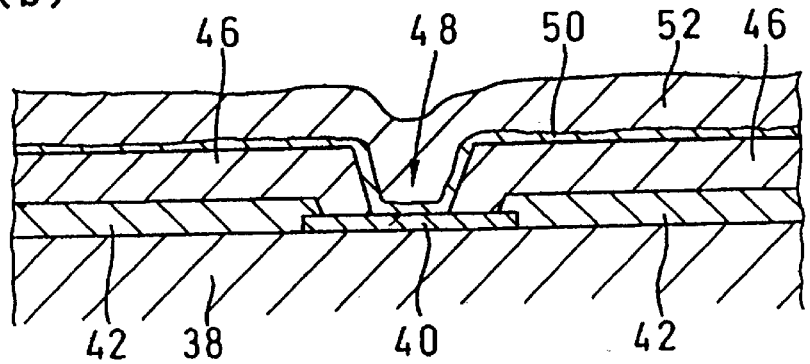

As shown in FIG. 7(a), a copper thin film layer 50 is then formed on roughened photosensitive resin layer 46. Layer 50 is formed preferably by electroless copper plating, but can be formed by vacuum deposition or other acceptable processes. Thin film layer 50 can be formed of other sound conductor materials and not limited to copper. As shown in FIG. 7(b), a thicker copper film layer 52 is formed on layer 50 using an electroplating method, the copper thin film layer 50 acting as an electrode. It is preferable that copper layer 52 be thicker than the underlying photosensitive resin layer 46 so that its copper will fill the via hole 48 formed in layer 46. Layer 52, like layer 50, may be formed of any other electrically conductive metal than copper.

Figure 7C:
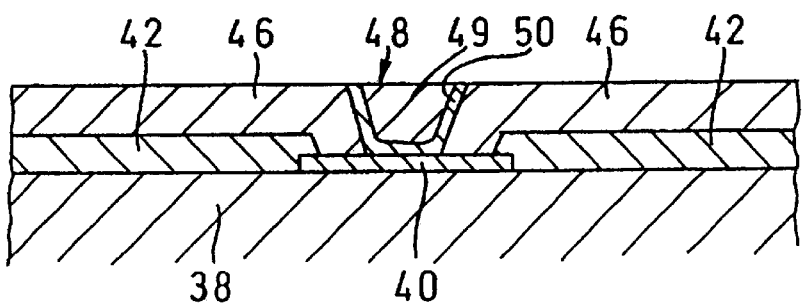
Figure 7D:
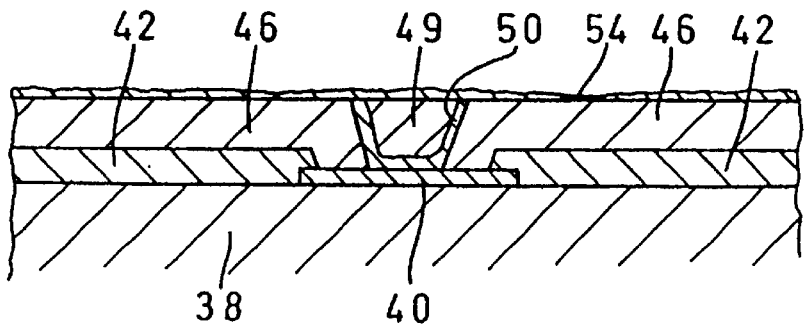

After forming the thick copper layer 52, layer 52 is ground until the photosensitive resin layer 46 (insulating layer) appears, as shown in FIG. 7(c). Thus, copper is filled only in the via hole 48 formed in the photosensitive resin layer 46. Formation of a first (lower) via 49 is now complete. An adhesive promoter 54 is then applied to the surface of the photosensitive resin layer 46. The adhesive promoter 54 is not particularly limited, as any known adhesive promoter can be used.

Figure 8:
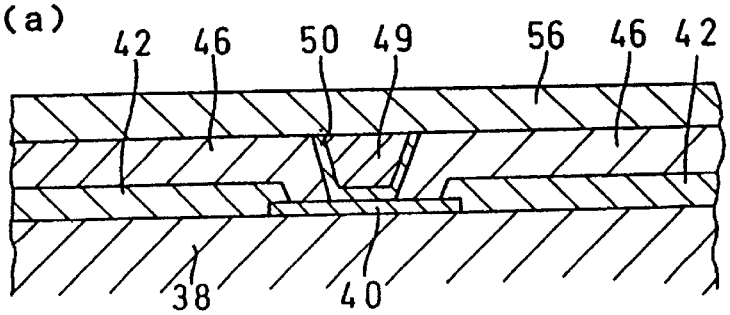
FIGS. 8(a) to 8(d) are enlarged, partial sectional views showing subsequent process steps in the embodiments of the method of producing an electronic device shown in FIGS. 6(a) and 7(d).
Figure 8:
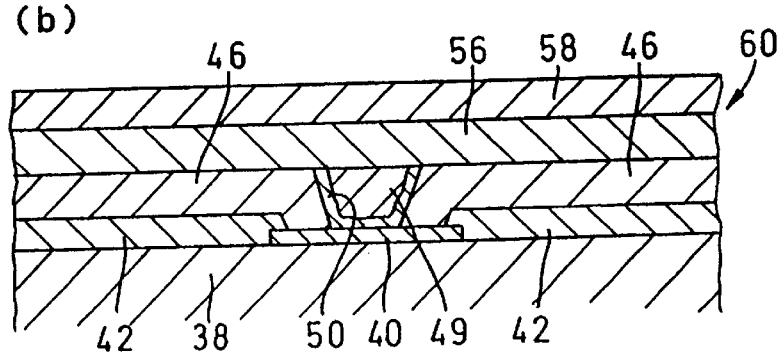
Figure 8:
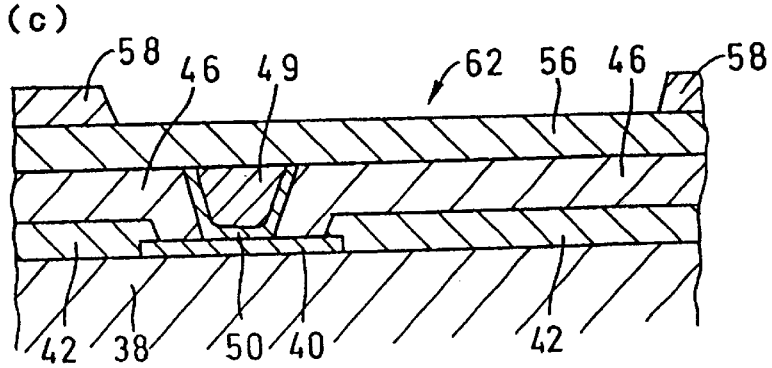
Figure 8:
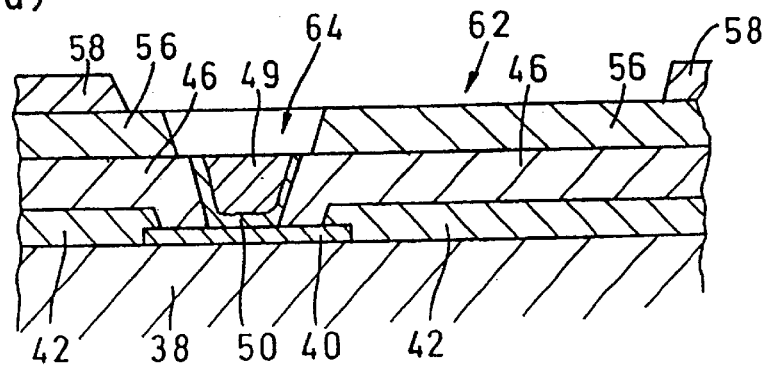

After adhesive promoter 54 is dried, an insulating non-photosensitive resin sheet is laminated as shown in FIG. 8(a) to form a non-photosensitive resin layer 56. Then, as shown in FIG. 8(b), an insulating photosensitive resin sheet 58 is laminated to non-photosensitive resin layer 56 under vacuum. Thus, a composite insulating layer 60 comprised of layers 56 and 58 is formed. In this embodiment, the same non-photosensitive and photosensitive resin material as used in the aforementioned embodiment can be used.

In the same manner as the aforementioned previous embodiment, photosensitive resin layer 58 is selectively exposed to light passing through a photomask (not shown) using a conventional photolithography process. Layer 58 is then developed to remove part of the layer to thereby form a patterned opening 62, as shown in FIG. 8(c). Since the immediately lower layer 56 is non-photosensitive, it is left as it is even after opening 62 is formed in the immediately above photosensitive resin layer. This patterned opening 62 defines the desired shape of a conductor to be eventually formed in the manner prescribed below.

As shown in FIG. 8(d), a second via hole 64 is formed by laser beam drilling at a predetermined position of the non-photosensitive resin layer 56 exposed through opening 62. The second via hole 64, like hole 49, is formed above the bonding pad 40 to thereby expose via 49. After forming via hole 64, the structure is cleaned using a conventional cleaning solvent and the surface of the layer 56 then roughened.

Figure 9:
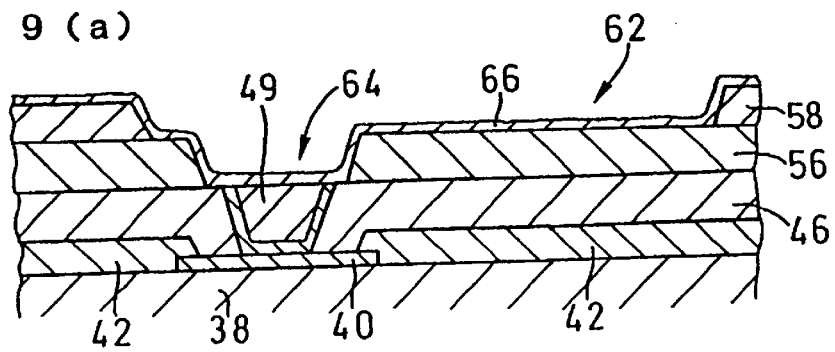
FIGS. 9(a) to 9(d) are enlarged, partial sectional views showing subsequent process steps in the embodiments of the method of producing an electronic device shown in FIGS. 6(a) to 8(d).
Figure 9:
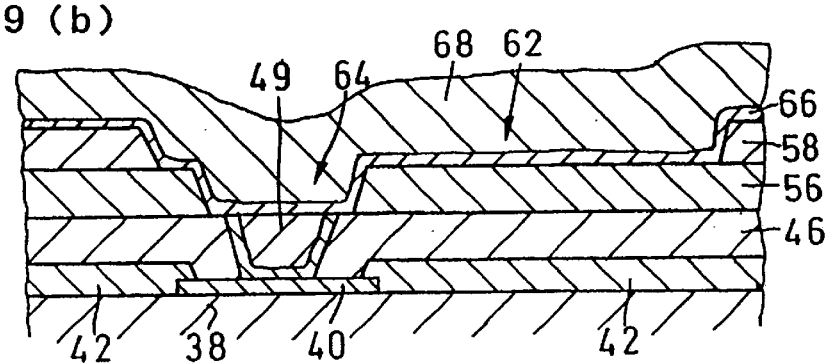
Figure 9:
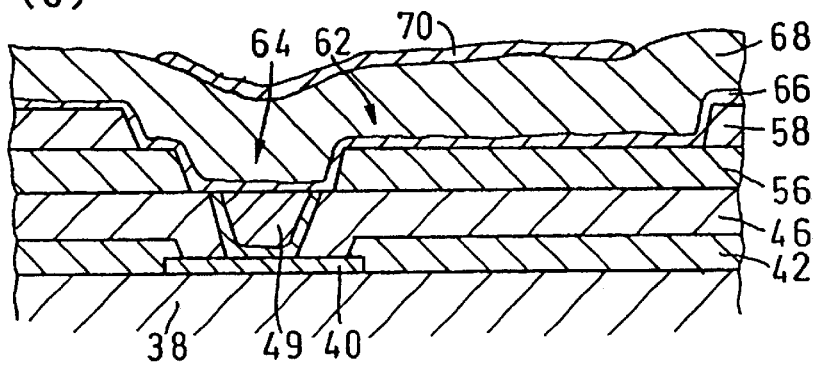
Figure 9:
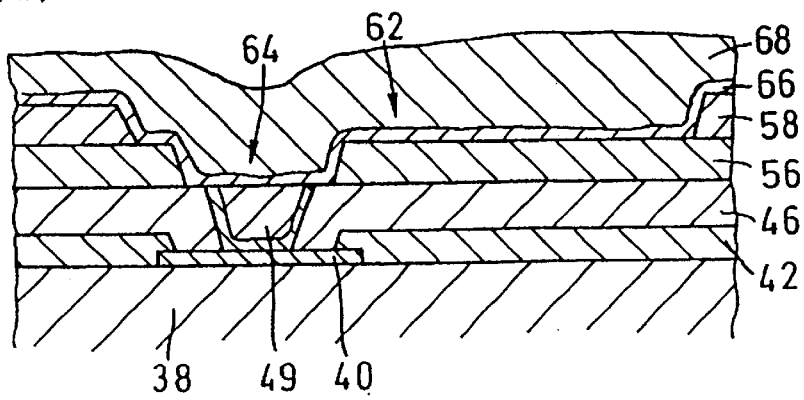

In the same manner as the aforementioned embodiment, a copper thin film layer 66 is then formed on the remaining exposed surfaces of layer 58 and underlying layer 56, preferably by electroless copper plating. Layer 66 is shown in FIG. 9(a). A copper thick film layer 68, which is thicker than both the copper layer 66 and photosensitive layer 58, is formed by a copper electroplating technique using the copper thin film layer as an electrode. This is shown in FIG. 9(b). Significantly, copper layer 68 is thick enough to completely fill opening 62. The surface of the thick copper layer 68 is uneven due to the opening pattern 62 formed in the photosensitive resin layer 58.

As shown in FIG. 9(c), a resist pattern 70 is formed on copper layer 68 using electrodeposition or applying a film resist. As shown in FIG. 9(d), wet etching is carried out to reduce unevenness in the surface of the copper thick film layer 68, and then the resist pattern 70 is removed. As stated before, the copper etching for reducing the unevenness may be omitted if the grinding apparatus to be used in the next planarization step does not require such pre-flattening.

Figure 10:
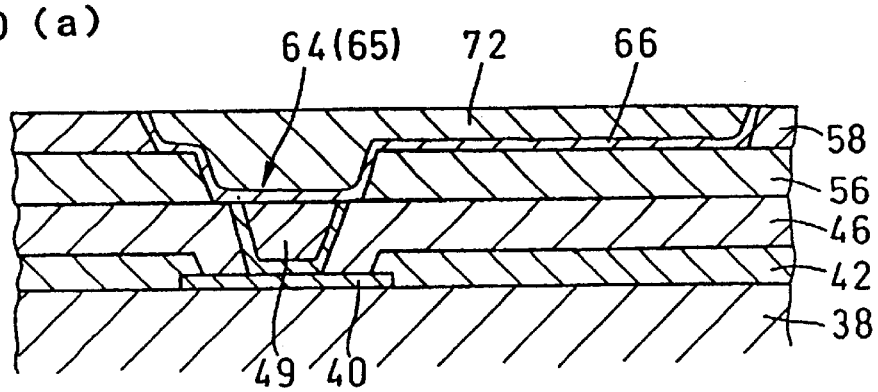
FIGS. 10(a) to 10(c) are enlarged sectional views showing subsequent process steps in the embodiments of the method of producing an electronic device shown in FIGS. 6(a) to 9(d).
Figure 10:
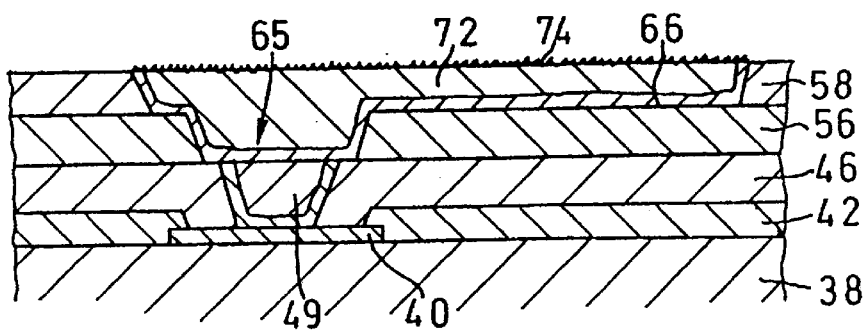
Figure 10:
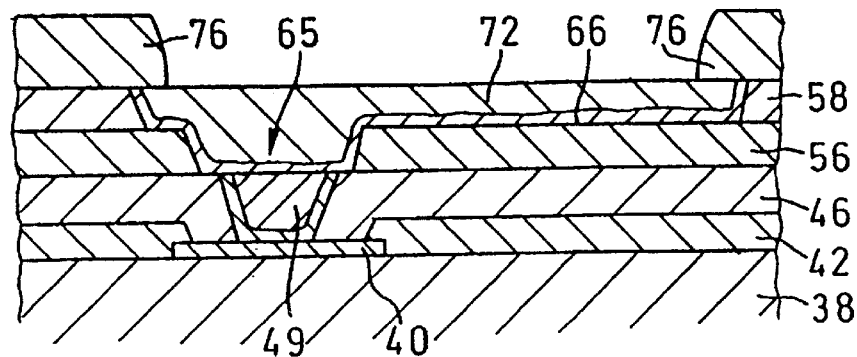

As shown in FIG. 10(a), thick layer 68 is ground flat until the surface of photosensitive resin layer 58 appears. Thus, a conductive via 65 connected to the lower via 49, and an upper circuit or pad 72 connected to the conductive via 65 are simultaneously formed. Although only one pair of aligned conductive vias are shown in FIG. 10(a), it is understood that several such pairs can be provided in a suitable substrate using the teachings of the invention. By repeating the above process, additional multi-layer wiring can be achieved.

Solder ball bumps 78 (FIG. 11) are attached to the pads 72 to form a ball grid array (BGA) package. Prior to attaching the bumps on the pads, the surface of the upper circuit 72 is subjected to an oxidation treatment to roughen the surface as shown in FIG. 10(b). In this FIG., the roughened surface is indicated as numeral 74. This treatment is carried out for the purpose of assuring firm bonding of a solder resist to the upper circuit 72, any known roughening method usable to accomplish this. Next, this solder resist 76 is applied to the roughened surface and patterned to expose the pad regions of the upper circuit 72 where the ball bumps are to be positioned, as shown in FIG. 10(c). Then, the exposed surface of circuit 72 is cleaned by a conventional cleaning method.

Figure 11:
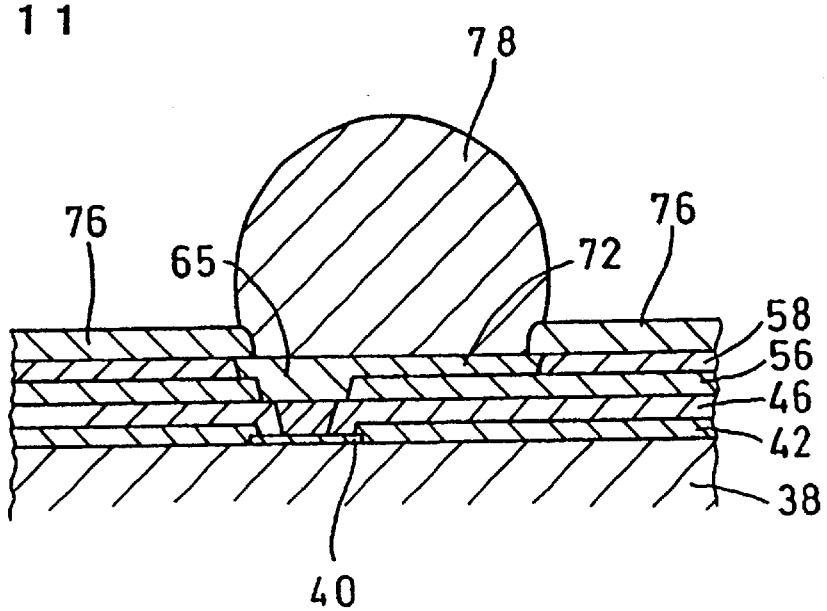
FIG. 11 is an enlarged, partial sectional view showing a ball bump produced by any one of the methods shown in FIGS. 6(a) to 10(c).
Figure 12:
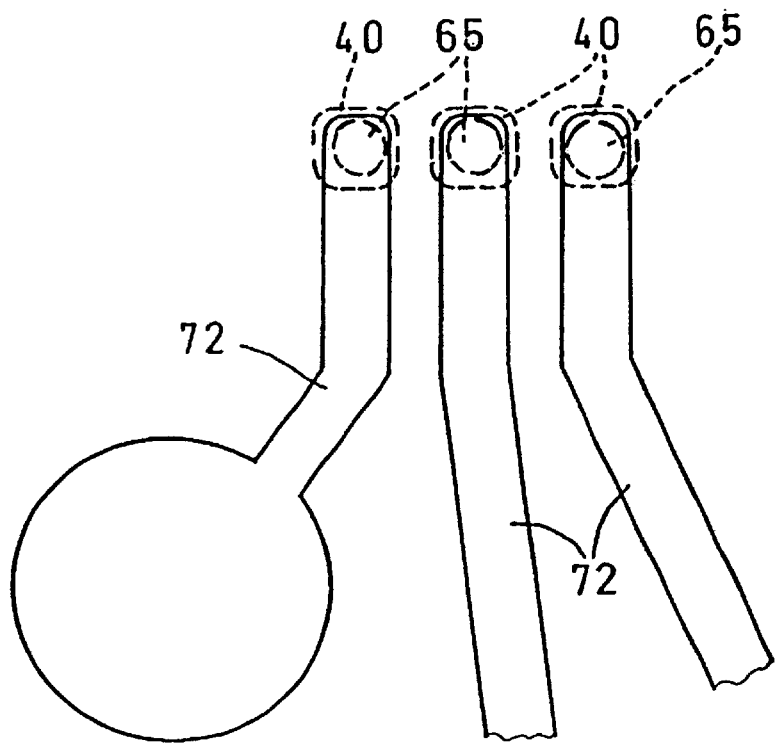
FIG. 12 is an enlarged plan view of a main part of the electronic device shown in FIG. 11.

Finally, as shown in FIG. 11, the aforementioned ball bump 78 is formed on each pad 72, and thus the ball grid array is formed. An example of the layout of the ball grid array including the upper circuit 72 and its pad, the conductive vias 65, the bonding pads 40 and the like is shown in the plan view of FIG. 12. The ball bump 78 positioning is dependent on the corresponding shape of the upper circuit 72 and the surrounding solder resist 76.

It is understood that the present invention is not limited to the specific embodiment depicted hereinabove. For example, as shown in FIGS. 9(a) and 13(a), after the surface including opening 62 is formed in photosensitive layer 58 and the second via hole 64 formed in layer 56 is covered with the thin copper layer 66, copper layer 66 may be removed from the surface of the photosensitive resin layer 58 (e.g., by grinding) as shown in FIG. 13(b). In this case, the thin copper layer 66 left in opening 62 forms the desired upper circuit 80, and the copper left in via hole 64 forms the conductive via 65. Although copper is preferred, thin film layer 66 can be formed of any sound electrically conductive metal.

As before, instead of using non-photosensitive and photosensitive materials in sheet form, liquid resin can be applied, for example, with an appropriate coater.

Next, a further embodiment of an electronic device according to the present invention will be described. As shown in FIG. 14, a printed wiring board 86 of this embodiment comprises: a substrate 12 on which a circuit 10 is formed; a composite insulating layer 82 laminated to the substrate 12; and a circuit 84 formed in insulating layer 82. In this printed wiring board 86, composite layer 82 is comprised of a first insulating layer 88 and a second insulating layer 90 on the layer 88. Significantly, substrate 12, first insulating layer 88 and second insulating layer 90 have coefficients of thermal expansion which increase in the order named. In this arrangement, when substrate 12 having a relatively low coefficient of thermal expansion and second insulating layer 90 having a higher coefficient of thermal expansion are thermally expanded (or contracted), the first insulating layer 88 sandwiched between the two exhibits a neutral behavior. For this reason, internal stresses between substrate 12 and the first insulating layer 88 and between the first insulating layer 88 and the second insulating layer 90 are reduced.

In this printed wiring board 86, it is preferable that the substrate 12, first insulating layer 88, and second insulating layer 90 have coefficients of thermal expansion of about $15 \times 10^{-6}$/° C. to about $20 \times 10^{-6}$/° C., about $30 \times 10^{-6}$/° C., and about $60 \times 10^{-6}$/° C. or more, respectively. Such an arrangement is effective to minimize internal stresses between the elements, and therefore connection failure can be prevented between upper and lower wiring layers.

As in the earlier embodiments, first insulating layer 88 is a non-photosensitive resin layer and second insulating layer 90 is a photosensitive resin layer. Glass epoxy resin, glass polyimide resin, cyanate resin, or the like can be used for substrate 12. Polyimide resins, epoxy resins, or the like can be used for layer 88. Polyimide resins, epoxy resins, or the like can be used for second layer 90.

Figure 15:
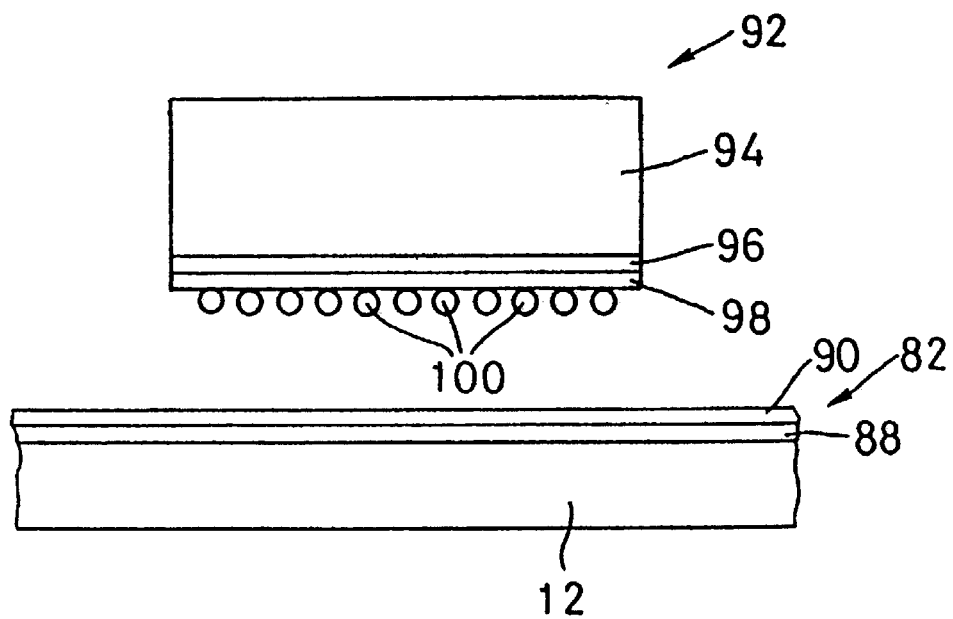
FIG. 15 is an enlarged view showing still another embodiment of the electronic device according to the present invention.

FIG. 15 shows an example of the use of one embodiment of the present invention, this being a printed wiring board and a semiconductor chip for being coupled to the board's circuitry. As in the case of the printed wiring board shown in FIG. 14, the composite insulating layer 82 of the printed wiring board shown in FIG. 15 is comprised of a first, non-photosensitive insulating layer 88 and a second, photosensitive insulating layer 90 on the uppermost layer side. Substrate 12, first insulating layer 88, and second insulating layer 90 are arranged so that the coefficients of thermal expansion increase in the order named. In the accompanying semiconductor chip 92, a first, non-photosensitive insulating layer 96 and a second, photosensitive insulating layer 98 are laminated to a conventional semiconductor chip substrate 94, and, furthermore, solder bumps 100 are formed on the second insulating layer 98 and electrically coupled to selected chip pads (not seen). In the semiconductor chip 92, the chip substrate 94, first insulating layer 96, and second insulating layer 98 are arranged so that the coefficients of thermal expansion increase in the order named.

When the printed wiring board having semiconductor chip 92 surface-mounted thereon are thermally expanded or thermally contracted due to heat cycle, the second insulating layer 90 and the second insulating layer 98 of the semiconductor chip 92 thermally expanded contract at substantially the same rate because both have similar coefficients of thermal expansion. For this reason, shearing stress caused by a difference in thermal expansion is substantially prevented on solder bumps 100 (which electrically connect the printed wiring board's conductors and chip pads). Connection failure does not occur during product operation, including warm-up and cool down cycles.

Therefore, connection reliability can be ensured without filling an underfill resin in the relatively small space between the chip and board.

As stated above, it is preferable that the first and second insulating layers of both chip and board are non-photosensitive and photosensitive, respectively. However, the invention need not be limited to this as layers can be non-photosensitive or photosensitive, provided the second insulating layer has a higher coefficient of thermal expansion than the first insulating layer in immediate contact with the underlying substrate (chip or board).

As described above, examples of electronic devices of the present invention include epoxy substrates, ceramic substrates, glass substrates (e.g., for a liquid crystal panel), and silicon substrates (e.g., semiconductor chips) and the more recent chip carriers (e.g., plastic ball grid arrays). In addition, various changes, modifications, and improvements can be made to the embodiment on the basis of knowledge of those skilled in the art without departing from the scope of the present invention.

What is claimed is:

1. An electronic assembly comprising:
    a substrate having a first coefficient of thermal expansion (CTE) and a circuit thereon;
    a first insulating layer on said substrate and covering said circuit, said first insulating layer having a second CTE greater than said first CTE and including a hole therein having access to said circuit;
    a second insulating layer on said first insulating layer and having a third CTE greater than said second CTE of said first insulating layer, said second insulating layer including an opening therein larger than said hole in said first insulating layer and aligned above said hole;
    a semiconductor chip having a fourth CTE;
    a third insulating layer on said semiconductor ship and having a fifth CTE greater than said fourth CTE of said semiconductor chip;
    a fourth insulating layer on said third insulating layer and having a sixth CTE greater than said fifth CTE of said third insulating layer; and
    a plurality of solder bumps electrically connecting said semiconductor chip to said substrate, wherein said assembly does not include an underfill resin between said substrate and said semiconductor chip, wherein said second insulating layer on said substrate and said fourth insulating layer on said semiconductor chip face one another and are separated by a gap, and wherein said third CTE of said second insulating layer is about equal to said sixth CTE of said fourth insulating layer.

2. The electronic assembly of claim 1, wherein said substrate is a printed circuit board.

3. The electronic assembly of claim 1, wherein said third insulating layer is a non-photosensitive layer and said fourth insulating layer is a photosensitive layer.

4. The electronic assembly of claim 1, wherein said first insulating layer is a non-photosensitive layer and said second insulating layer is a photosensitive layer, and wherein said third insulating layer is a non-photosensitive and said fourth insulating layer is photosensitive.

5. The electronic assembly of claim 1, wherein said first insulating layer is a non-photosensitive layer and said second insulating layer is a photosensitive layer, and wherein said third insulating layer is a non-photosensitive and said fourth insulating layer is photosensitive.

6. An electronic assembly comprising:
   a substrate having a first coefficient of thermal expansion (CTE) and a circuit thereon;
   a first insulating layer on said substrate and covering said circuit, said first insulating layer having a second CTE greater than said first CTE and including a hole therein having access to said circuit;
   a second insulating layer on said first insulating layer and having a third CTE greater than said second CTE of said first insulating layer, said second insulating layer including an opening therein larger than said hole in said firt insulating layer and aligned above said hole;
   a semiconductor chip having a fourth CTE;
   a third insulating layer on said semiconductor ship and having a fifth CTE greater than said fourth CTE of said semiconductor chip;
   a fourth insulating layer on said third insulating layer and having a sixth CTE greater than said fifth CTE of said third insulating layer; and
   a plurality of solder bumps electrically connecting said semiconductor chip to said substrate, wherein said assembly does not include an underfill resin between said substrate and said semiconductor chip, wherein said first insulating layer is a non-photosensitive layer and said second insulating layer is a photosensitive layer.

7. The electronic assembly of claim 5, wherein said third insulating layer is non-photosensitive and said fourth insulating layer is photosensitive.

8. The electronic assembly of claim 5, wherein said third CTE of said second insulating layer is at least $60\times10^{-6}/°$ C.

9. An electronic assembly comprising:
   a substrate having a first coefficient of thermal expansion (CTE) and a circuit thereon;
   a first insulating layer on said substrate and covering said circuit, said first insulating layer having a second CTE greater than said first CTE and including a hole therein having access to said circuit;
   a second insulating layer on said first insulating layer and having a third CTE greater than said second CTE of said first insulating layer, said second insulating layer including an opening therein larger than said hole in said first insulating layer and aligned above said hole;
   a semiconductor chip having a fourth CTE;
   a third insulating layer on said semiconductor chip and having a fifth CTE greater than said fourth CTE of said semiconductor chip;
   a fourth insulating layer on said third insulating layer and having a sixth CTE greater than said fifth CTE of said third insulating layer; and
   a plurality of solder bumps electrically connecting said semiconductor chip to said substrate, wherein said assembly does not include an underfill resin between said substrate and said semiconductor chip, wherein said third insulating layer is a non-photosensitive layer and said fourth insulating layer is a photosensitive layer.

10. The electronic assembly of claim 8, wherein said third CTE of said second insulating layer is at least $60\times10^{-6}/°$ C.

11. The electronic assembly of claim 8, wherein said first and second insulating layers are each photosensitive.

12. The electronic assembly of claim 8, wherein said first and second insulating layers are each non-photosensitive.

13. An electronic assembly comprising:
   a substrate having a first coefficient of thermal expansion (CTE) and a circuit thereon;
   a first insulating layer on said substrate and covering said circuit, said first insulating layer having a second CTE greater than said first CTE and including a hole therein having access to said circuit;
   a second insulating layer on said first insulating layer and having a third CTE greater than said second CTE of said first insulating layer, said second insulating layer including an opening therein larger than said hole in said first insulating layer and aligned above said hole;
   a semiconductor chip having a fourth CTE;
   a third insulating layer on said semiconductor ship and having a fifth CTE greater than said fourth CTE of said semiconductor chip;
   a fourth insulating layer on said third insulating layer and having a sixth CTE greater than said fifth CTE of said third insulating layer; and
   a plurality of solder bumps electrically connecting said semiconductor chip to said substrate, wherein said assembly does not include an underfill resin between said substrate and said semiconductor chip, and wherein said third CTE of said second insulating layer is at least $60\times10^{-6}/°$ C.

* * * * *